US009875903B2

(12) United States Patent
Shreve et al.

(10) Patent No.: US 9,875,903 B2
(45) Date of Patent: Jan. 23, 2018

(54) STORE RESOURCE EVENT DETECTION

(71) Applicant: Conduent Business Services, LLC, Dallas, TX (US)

(72) Inventors: Matthew A. Shreve, Tampa, FL (US); Michael C. Mongeon, Walworth, NY (US); Edgar A. Bernal, Webster, NY (US); Robert P. Loce, Webster, NY (US)

(73) Assignee: Conduent Business Services, LLC, Dallas, TX (US)

( * ) Notice: Subject to any disclaimer, the term of this patent is extended or adjusted under 35 U.S.C. 154(b) by 0 days.

(21) Appl. No.: 14/672,943

(22) Filed: Mar. 30, 2015

(65) Prior Publication Data

US 2015/0310606 A1 Oct. 29, 2015

Related U.S. Application Data

(60) Provisional application No. 61/984,519, filed on Apr. 25, 2014.

(51) Int. Cl.
| | |
|---|---|
| G06K 9/00 | (2006.01) |
| H01L 21/285 | (2006.01) |
| H04N 7/18 | (2006.01) |
| C23C 16/00 | (2006.01) |
| H01J 37/32 | (2006.01) |
| H01L 21/02 | (2006.01) |
| H01L 21/265 | (2006.01) |
| H01L 21/3065 | (2006.01) |
| H01L 21/311 | (2006.01) |
| H01L 21/3213 | (2006.01) |
| H01L 21/683 | (2006.01) |

(52) U.S. Cl.
CPC ........ *H01L 21/28556* (2013.01); *C23C 16/00* (2013.01); *H01J 37/32715* (2013.01); *H01L 21/0228* (2013.01); *H01L 21/0262* (2013.01); *H01L 21/02252* (2013.01); *H01L 21/02274* (2013.01); *H01L 21/265* (2013.01); *H01L 21/3065* (2013.01); *H01L 21/31116* (2013.01); *H01L 21/31138* (2013.01); *H01L 21/32136* (2013.01); *H01L 21/6833* (2013.01); *H04N 7/181* (2013.01); *H04N 7/188* (2013.01); *G06K 2009/00738* (2013.01)

(58) Field of Classification Search
CPC combination set(s) only.
See application file for complete search history.

(56) References Cited

U.S. PATENT DOCUMENTS

2005/0271250 A1* 12/2005 Vallone ............ G06K 9/00288
382/103
2013/0044921 A1* 2/2013 In ..................... H04M 1/72583
382/115

* cited by examiner

*Primary Examiner* — Alex Liew
(74) *Attorney, Agent, or Firm* — Fay Sharpe LLP

(57) ABSTRACT

A computer vision system (100) operates to monitor an environment (e.g., such as a restaurant, store or other retail establishment) including a resource located therein (e.g., such as a restroom, a dining table, a drink, condiment or supply dispenser, a trash receptacle or a tray collection rack). The system includes: an image source or camera (104) that supplies image data (130) representative of at least a portion of the environment monitored by the system, the portion including the resource therein; and an event detection device (102) including a data processor (112) and operative to detect an event involving the resource. Suitably, the event detection device is arranged to: (i) be selectively configurable by a user to define the event involving the resource; (ii) receive the image data supplied by the image source; (iii) analyze the received image data to detect the defined event; and (iv) output a notification in response to detecting the defined event.

17 Claims, 6 Drawing Sheets

STORE RESOURCE EVENT DETECTION

BACKGROUND

The subject matter of the present specification generally relates to the art of machine and/or computer vision systems. Exemplary embodiments disclosed herein find particular application in conjunction with restaurant environments, and they will be described herein with particular reference thereto. However, it is to be appreciated that various exemplary embodiments such as those disclosed herein are also amenable to other like applications and/or other types of environments, e.g., such as stores, offices, public facilities, etc.

In various retail settings and/or other like environments (e.g., such as a store or restaurant), it can be desirable to keep track of several common activities, conditions, statuses and/or occurrences which may arise during the course of operations at that location. For example, in a typical restaurant setting, these may include table occupancy, overfilled trashcans, restroom use, the availability of condiments, straws, cups, plastic ware, napkins, etc. at dispensing locations, the cleanliness of various surfaces, such as floors, tables, counters and/or windows, etc. In practice, those conditions that one might normally want to address in one way or another may go unnoticed and/or unattended for long periods of time, which can reduce customer satisfaction and may even result in a direct or indirect loss of revenue. For example, customers may leave the store or restaurant if they see that there are no open and clean tables, or may not return to the store or restaurant in the future based on a negative experience. At times, these issues may be noticed by a manager and/or other employee at the location; however, because of understaffing, busy workloads and/or other factors, it may not be readily feasible to always provide the proper amount of resources to notice and/or address each concern.

The aforementioned store resources (e.g., where a store resource is generally used herein to denote a good or service or other activity provided by and/or in the store) are commonly maintained and/or attended to by one or more employees of the store or other individuals. One customary approach for maintaining some store resources involves attending to various resources on a regular time-based schedule. For example, restrooms are cleaned and/or restocked with toilet paper, paper towels and/or hand soap at regularly scheduled intervals, trashcans are emptied at set times, condiments are re-filled on a preset schedule, etc. However, maintaining and/or attending to store resources on a preset schedule runs the risk of, on one hand, wasting employee time and/or man-hours on items which may not yet benefit from attention or maintenance (e.g., emptying a trashcan that is significantly less than full or restocking a bathroom that still has plenty of supplies, etc.); and on the other hand, there is the risk of not addressing a concern or issue in due time (e.g., an unattended trashcan can overflow with garbage, condiments and/or other supplies may be completely depleted from their dispensers, etc.).

Therefore, it is desirable to have a system and/or method operative in a retail, store or other like environment which does not rely solely on a preset schedule for the maintenance and/or attending to of store resources.

Accordingly, a new and/or improved method and/or system is disclosed herein which monitors an environment for one or more given conditions and automatically provides alerts and/or notifications upon detection thereof.

INCORPORATION BY REFERENCE

The following are incorporated herein by reference in their entirety:
U.S. patent application Ser. No. 13/911,105, filed Jun. 6, 2013;
U.S. patent application Ser. No. 13/598,098, filed Aug. 29, 2012;
U.S. patent application Ser. No. 13/964,652, filed Aug. 12, 2013;
U.S. patent application Ser. No. 13/973,330, filed Aug. 22, 2013; and
U.S. patent application Ser. No. 13/933,194, filed Jul. 2, 2013.

BRIEF DESCRIPTION

This Brief Description is provided to introduce concepts related to the present specification. It is not intended to identify essential features of the claimed subject matter nor is it intended for use in determining or limiting the scope of the claimed subject matter. The exemplary embodiments described below are not intended to be exhaustive or to limit the claims to the precise forms disclosed in the following Detailed Description. Rather, the embodiments are chosen and described so that others skilled in the art may appreciate and understand the principles and practices of the subject matter presented herein.

In accordance with one exemplary embodiment, a computer vision system is provided that operates to monitor an environment including a resource located therein. The system includes: an image source that supplies image data representative of at least a portion of the environment monitored by the system, the portion including the resource therein; and an event detection device including a data processor and operative to detect an event involving the resource. Suitably, the event detection device is arranged to: (i) be selectively configurable by a user to define the event involving the resource; (ii) receive the image data supplied by the image source; (iii) analyze the received image data to detect the defined event; and (iv) output a notification in response to detecting the defined event.

In accordance with another exemplary embodiment, a method is provided for monitoring an environment including a resource located therein. The method includes: obtaining image data representative of at least a portion of the environment being monitored, the portion including the resource therein; receiving configuration data, the configuration data defining an event involving the resource; analyzing the obtained image data to detect the defined event; and outputting a notification in response to detecting the defined event.

Numerous advantages and benefits of the subject matter disclosed herein will become apparent to those of ordinary skill in the art upon reading and understanding the present specification. It is to be understood, however, that the detailed description of the various embodiments and specific examples, while indicating preferred and/or other embodiments, are given by way of illustration and not limitation.

BRIEF DESCRIPTION OF THE DRAWINGS

The following Detailed Description makes reference to the figures in the accompanying drawings. However, the inventive subject matter disclosed herein may take form in various components and arrangements of components, and in various steps and arrangements of steps. The drawings are only for purposes of illustrating exemplary and/or preferred embodiments and are not to be construed as limiting. Further, it is to be appreciated that the drawings may not be to scale.

DETAILED DESCRIPTION

Figure 1:
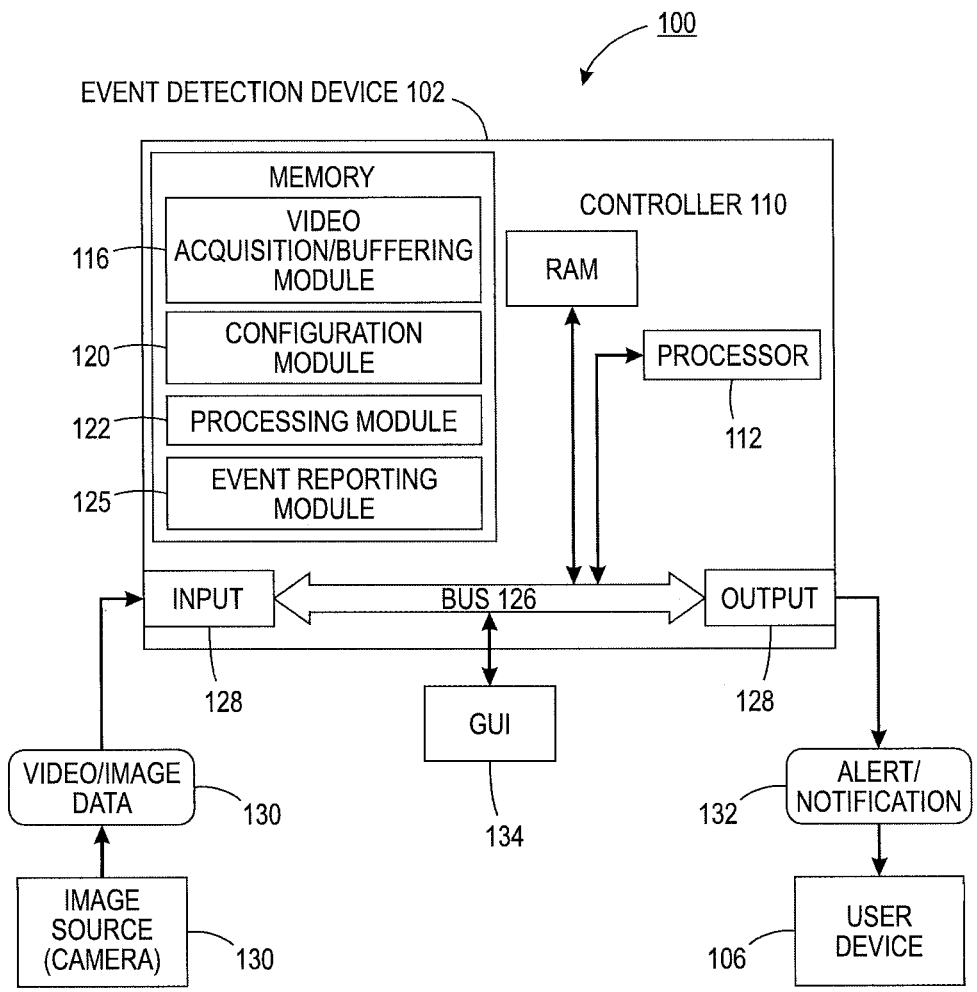
FIG. 1 is a diagrammatic illustration showing an exemplary system suitable for practicing aspects of the present inventive subject matter.

For clarity and simplicity, the present specification shall refer to structural and/or functional elements, relevant standards, algorithms and/or protocols, and other components, methods and/or processes that are commonly known in the art without further detailed explanation as to their configuration or operation except to the extent they have been modified or altered in accordance with and/or to accommodate the preferred and/or other embodiment(s) presented herein. Moreover, the apparatuses and methods disclosed in the present specification are described in detail by way of examples and with reference to the figures. Unless otherwise specified, like numbers in the figures indicate references to the same, similar or corresponding elements throughout the figures. It will be appreciated that modifications to disclosed and described examples, arrangements, configurations, components, elements, apparatuses, methods, materials, etc. can be made and may be desired for a specific application. In this disclosure, any identification of specific materials, techniques, arrangements, etc. are either related to a specific example presented or are merely a general description of such a material, technique, arrangement, etc. Identifications of specific details or examples are not intended to be, and should not be, construed as mandatory or limiting unless specifically designated as such. Selected examples of apparatuses and methods are hereinafter disclosed and described in detail with reference made to the figures.

In general, there is disclosed herein a machine and/or computer vision system that monitors an environment (e.g., a restaurant or other like establishment or a store) to automatically detect one or more specified conditions and/or activities therein. Upon sufficient detection of a specified condition and/or activity (i.e., a detected event), an alert or notification may be automatically provided.

In one suitable embodiment, the system is configurable by a user or otherwise to suit the particular location and/or environment being monitored and/or the specific objectives of the establishment at that location. In practice, one or more surveillance cameras are arranged to view the environment and/or specific locations. Within the view(s) of the camera(s) (e.g., within the video frames and/or image data captured and/or otherwise obtained by the camera(s)), a region of interest (ROI) or multiple ROIs are defined in which particular events, conditions and/or activities are to be detected.

In accordance with one exemplary embodiment, for each ROI or combination of ROIs, a set of suitable parameters are established and/or otherwise determined. Optionally, these parameters may be entered and/or set by a user of the system. For example, one parameter may be used to specify one or more "action types" that are identifiable within the ROI and that are indicative of the event, condition or activity to be detected within the ROI associated with the parameter being set or defined. Based on the activity observed, a detected event is classified accordingly. Suitably, the action type may be "motion" or "appearance change" or a combination thereof. For example, when the action type parameter is set to "motion," the ROI is monitored to identify the occurrence of motion therein (e.g., such as a person or part of a person moving through the ROI). Additionally, features descriptive of the identified motion can be used (e.g., direction and magnitude of motion). When the action type parameter is set to "appearance change," the ROI is monitored to identify a more persistent change in the general and/or overall appearance of the ROI. For example, such a change in appearance may occur when trash is left behind in the ROI or when objects otherwise normally within the ROI disappear therefrom, e.g., when a cup or straw or napkin or condiment packet or other item no longer appears in the location from which it is normally dispensed. In the case where the action type parameter is set to "motion+appearance change," the ROI is monitored to identify both motion within the ROI and a more persistent change in the overall/general appearance of the ROI. Optionally, other parameters may also be set, established and/or otherwise determined, e.g., such as parameters specific to a given action type, various thresholds (e.g., indicating the number of times an activity or condition or action is to be detected before a notification or alert is issued), time limits, parameters establishing relationships between action types when dual or multiple action types are designated, etc.

In one exemplary embodiment, the system is equipped and/or provisioned with a configuration module that is employed to Carry out, regulate and/or administer the foregoing configuration operations. Suitably, the configuration module is operable so that the system may accept user input of the various parameters and/or configuration settings to define one or more events (e.g., conditions and/or activities) which are to be detected by the system. In one exemplary embodiment, having defined the events the system is to detect using the configuration module, a processing module suitably carries out the detection in accordance therewith. That is to say, for example, where a motion type action is specified for a given ROI, the processing module may detect in the specified ROI the occurrence of motion and optionally the degree or amount of movement, an angle or direction of the movement, and/or other spatio-temporal features extracted from the image within the ROI using techniques that include the three-dimensional (3D) Scale Invariant Feature Transform (3DSIFT), 3D Histogram of Oriented Gradients (3DHOG), dense trajectories, among others. Using these spatio-temporal features, a classifier can be trained to detect certain types of motion-based actions and/or gestures within the ROI. In another instance, where a change of appearance type of action is specified for a given ROI, the processing module may detect a significant change of appearance in the specified ROI, e.g., by comparing the obtained video frames and/or image data from the ROI with a stored model representing the nominal baseline appearance of the ROI. The stored model representing the normal appearance of the ROI may also be a trained classifier that is capable of distinguishing between normal and non-normal images found within the ROI. Optionally, where both motion and appearance change are specified for a ROI, the processing module may be operative to detect both as described herein.

Suitably, the system is further provisioned and/or equipped with an event reporting module. In practice, the event reporting module may output alerts and/or notifications of events, conditions and/or activities detected by the system. Optionally, a counter (e.g., associated with, accessible by and/or incorporate in the event reporting module) keeps track of how many times a particular event is detected, e.g., how many time a store resource is used. In one exemplary embodiment, when the number of times that a given event is detected satisfies a pre-defined condition (e.g., a configurable and/or otherwise determined threshold), an alert or notification is provided (e.g., via the event reporting module) which signals or otherwise indicates that it is time to maintain and/or attend to a particular store resource associated with the given detected event. For example, a detected event may be the use of a monitored trashcan or the use of a restroom or the taking of a condiment or other supply from a dispenser, etc. Accordingly, if the number of times the monitored store resource is used satisfies a given threshold (e.g., if the number of detected events or uses is greater than or equal to the threshold), then a particular alert or notification is provided indicating that it is time to maintain and/or attend to that store resource (e.g., the alert or notification signals or indicates that it is time to empty the trashcan, service the restroom, refill the dispenser, etc. as the case may be). Optionally, another particular detected event may be the maintenance and/or attending to of a store resource. Suitably, when such an event is detected (e.g., the servicing of a restroom, the emptying of a trashcan, the refilling of a dispenser, etc.), a prior corresponding alert or notification (indicating that maintenance should be provided) ceases (and/or another signal, alert, notification and/or indication is output that signifies that the maintenance has been provided) and optionally the associated store resource usage counter may be reset, e.g., to zero.

With reference now to FIG. 1, there is shown a diagrammatic/schematic illustration of an exemplary vision-based store information system (SIS) 100 as discussed above. The system 100 includes an event detection device 102 and an image source 104 (e.g., such as the surveillance camera(s) mentioned above) linked together by communication links, referred to herein as a network. In one embodiment, the system 100 may be in further communication with a user device 106. These components are described in greater detail below.

The event detection device 102 illustrated in FIG. 1 includes a controller 110 that is part of or associated with the device 102. The exemplary controller 110 is adapted for controlling an analysis of video data, video frames and/or image data 130 (hereinafter "image data") received by the system 100. The controller 110 includes a processor 112, which controls the overall operation of the device 102 by execution of processing instructions that are stored in a memory 114 connected to the processor 112

The memory 114 may represent any type of tangible computer readable medium such as random access memory (RAM), read only memory (ROM), magnetic disk or tape, optical disk, flash memory, or holographic memory. In one embodiment, the memory 114 comprises a combination of random access memory and read only memory. The digital processor 112 can be variously embodied, such as by a single-core processor, a dual-core processor (or more generally by a multiple-core processor), a digital processor and cooperating math coprocessor, a digital controller, or the like. The digital processor, in addition to controlling the operation of the device 102, executes instructions stored in memory 114 for performing the parts of the methods, functions and/or operations outlined herein. In some embodiments, the processor 112 and memory 114 may be combined in a single chip.

The device 102 may be embodied in a networked device, such as the image source 104, although it is also contemplated that the device 102 may be located elsewhere on a network to which the system 100 is connected, such as on a central server, a networked computer, or the like, or distributed throughout the network or otherwise accessible thereto. In other words, the processing can be performed within the image source 104 on site or in a central processing offline or server computer after transferring the image data through a network. In one embodiment, the image source 104 can be a device adapted to relay and/or transmit the image data 130 to the device 102. In another embodiment, the image data 130 may be input from any suitable source, such as a workstation, a database, a memory storage device, such as a disk, or the like. The image source 104 is in communication with the controller 110 containing the processor 112 and memory 114.

The stages and/or operations disclosed herein are performed by the processor 112 according to the instructions contained in the memory 114. In particular, the memory 114 stores a buffering module 116, which acquires image data of the environment and/or region(s) observed by the image source 104; a configuration module 120 which is operable to conduct, regulate and/or administer the collection of configuration parameters and/or settings and/or otherwise define one or more events to be detected (as discussed above); a processing module 122 (as discussed above) which is operable to conduct, regulate and/or administer analysis of the buffered image data in order to detect events as defined by the configuration module 120; and, an event reporting module 125 (as discussed above), which provides notifications and/or alerts of detected events and/or otherwise outputs selected data in accordance with detected events. Embodiments are contemplated wherein these instructions can be stored in a single module or as multiple modules embodied in different devices.

The software modules as used herein, are intended to encompass any collection or set of instructions executable by the device 102 or other digital system so as to configure the computer or other digital system to perform the task that is the intent of the software. The term "software" as used herein is intended to encompass such instructions stored in storage medium such as RAM, a hard disk, optical disk, or so forth, and is also intended to encompass so-called "firmware" that is software stored on a ROM or so forth. Such software may be organized in various ways, and may include software components organized as libraries, internet-based programs stored on a remote server or so forth, source code, interpretive code, object code, directly executable code, and so forth. It is contemplated that the software may invoke system-level code or calls to other software residing on a server (not shown) or other location to perform certain functions. The various components of the device 102 may be all connected by a bus 126.

With continued reference to FIG. 1, the device 102 also includes one or more communication interfaces 128, such as network interfaces, for communicating with external devices. The communication interfaces 128 may include, for example, a modem, a router, a cable, an Ethernet port, etc. At least one of the communication interfaces 128 is adapted to receive the image data 130 as input.

The device 102 may include one or more special purpose or general purpose computing devices, such as a server computer, controller, or any other computing device capable of executing instructions for performing the exemplary methods, functions and/or operations described herein.

FIG. 1 further illustrates the device 102 connected to the image source 104 for acquiring and/or providing the image data 130 in electronic format. The source 104 (hereinafter "camera 104") may include one or more surveillance cameras that capture video and/or image data from the observed environment and/or region(s) which the camera 104 is viewing. The number of cameras may vary, e.g., depending on a size of the location being monitored. For performing the method at night in areas without external sources of illumination or with irregular illumination from ambient sources, the camera 104 can include near infrared (NIR) capabilities at the low-end portion of a near-infrared spectrum (700 nm-1000 nm). No specific requirements are needed regarding spatial or temporal resolutions. The image source, in one embodiment, can include a surveillance camera with a video graphics array size that is about 1280 pixels wide and 720 pixels tall. Furthermore, the camera 104 used in the present disclosure is suitably operative to capture video at a frame rate that is able (sufficiently high enough, e.g., 30 frames/sec) to handle one or more subjects moving through the scene at anticipated speeds.

In one embodiment, the image source 104 can be a device adapted to relay and/or transmit the video captured by the camera to the event detection device 102. For example, the image source 104 can include a camera sensitive to visible light or having specific spectral sensitivities, a network of such cameras, a line-scan camera, a computer, a hard drive, or other image sensing and storage devices. In another embodiment, the video data 130 may be input from any suitable source, such as a workstation, a database, a memory storage device, such as a disk, or the like.

With continued reference to FIG. 1, the image data 130 undergoes processing by the device 102 to output (from at least one of the interfaces 128) an alert or notification or other suitable data/information 132 in response to an event (e.g., as defined via the configuration module 120) being detected (e.g., via the processing module 122).

Furthermore, the system 100 can display the output in a suitable form on a graphic user interface (GUI) 134. The GUI 134 can include a display for displaying output notifications, alerts, information and/or data, to users, and a user input device, such as a keyboard or touch or writable screen, for receiving instructions and/or configuration parameters as input, and/or a cursor control device, such as a mouse, touchpad, trackball, or the like, for communicating user input information, data, configuration parameters and command selections to the processor 112. Alternatively, the device 102 can provide the output to a user device 106, which can display the output to a user and collect input therefrom.

Figure 2:
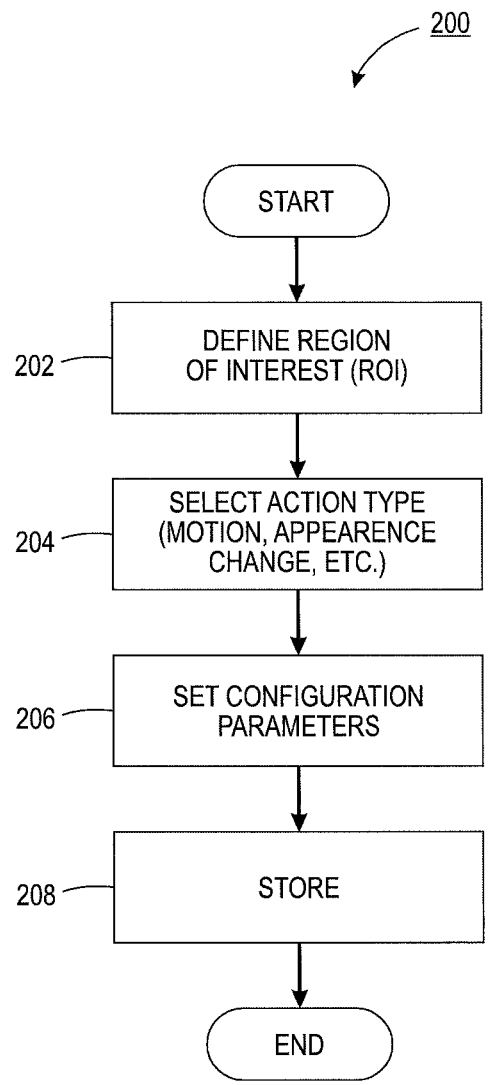
FIG. 2 is a flow chart showing an exemplary configuration process in accordance with aspects of the present inventive subject matter.

With reference now to FIG. 2, there is illustrated a flow chart showing an exemplary method 200 (e.g., executed via the configuration module 120) for defining an event and/or configuring the system 100 to detect a defined event.

Figure 3:
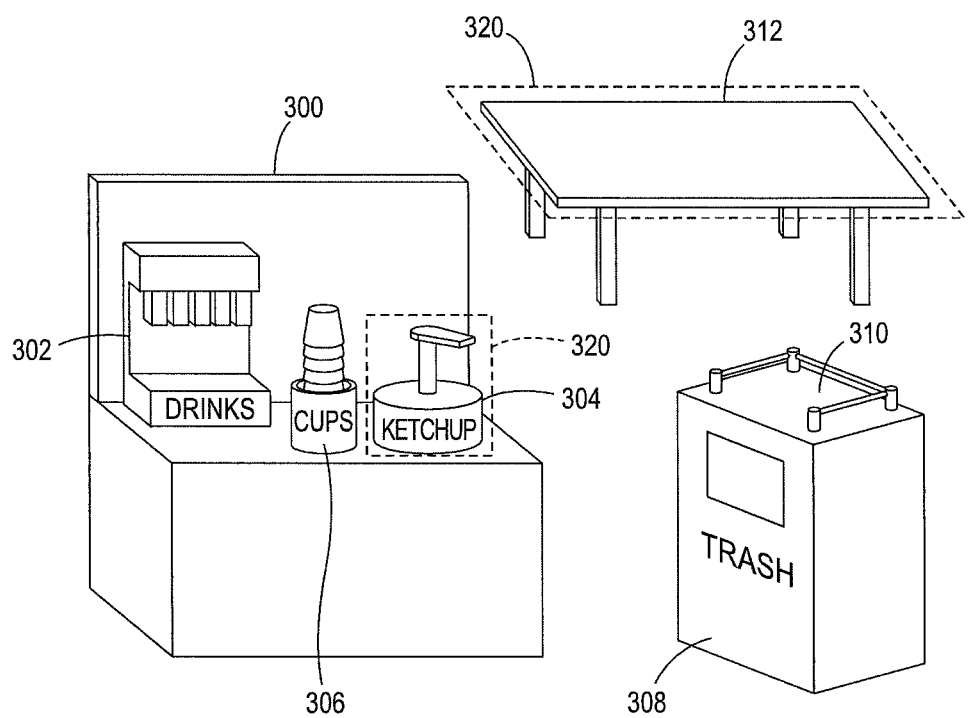
FIG. 3 is a diagrammatic illustration showing an exemplary scene viewed by the camera of the system shown in FIG. 1, including exemplary regions of interest (ROIs) defined therein.

As shown in step 202, the configuration process suitably begins by selecting and/or otherwise defining a ROI. With additional reference to FIG. 3, there is depicted an exemplary scene or environment viewed, e.g., by the camera 104. In the illustrated scene, for example, there may be a self-server station 300, including one or more fountain drink and/or ice dispensers 302, condiment dispensers 304 and/or other containers and/or dispensers 306 for various self-service items and/or supplies (e.g., such as napkins, plastic ware, straws, cups, lids, condiment packets, etc.). The scene may also include one or more trash bins 308, food tray return areas 310 thereabout and/or tables 312, e.g., at which customers may sit. In the illustrated scene, there are defined two exemplary ROIs 320, i.e., one ROI 320 is define about a table 312 and the other ROI 320 is defined about a condiment dispenser 304. In practice however, more or less ROIs may be defined about any one or more of the relevant objects and/or regions within a scene that a user desires the system 100 to monitor for event detection.

In one optional embodiment, a ROI is manually selected. For example, the ROI selection process may work the following way: a user selects a ROI by defining a shape that covers the region of the image or image data where it is desired to detect the occurrence of a given event (e.g., this may be one of the ROIs 320 in FIG. 3). The user may make these selections by specifying coordinates (pixel (x,y) locations) and shapes (squares, rectangles, ovals, etc.) or by clicking on regions in the image with a cursor or by otherwise entering parameters via a user interface. Alternatively, certain regions (e.g., such as table tops, chairs, self-service areas, etc.) may be automatically identified as ROIs, e.g., using a trained computer vision classifier. For example, an algorithm may be trained to detect rectangular table tops of a particular color. Suitably, table top height and distance from the camera 104 can be used to account for distortions of the table top shape due to perspective or other camera distortion.

Returning attention to FIG. 2, as shown in step 204, the user selects the type of action (e.g., motion, appearance change or a combination thereof or some other type of action) that is to be monitored within the ROI defined and/or established in step 202. For instance, a motion event could be a customer accessing the condiment or self-service area in a restaurant, trash bin use, etc. An appearance change, for example, could indicate trash left behind on a table or a spilled beverage or condiment in the self-service area, or the absence or removal of self-service items from the self-service area, or clothes left on the floor in a department store, etc. A motion along with an appearance change may be, for example, indicative of an event that consists of motion as well as an appearance change. For instance, monitoring a customer sitting down at a table will trigger motion events as well as appearance change events. Suitably, a defined relationship between these two action types can be used to detect when a customer leaves their trash on the table after leaving the store.

As shown in step 206, based on the action type(s) selected in step 204 for a given event to be detected, the user is optionally presented with a configuration interface and/or configuration options whereby parameters can be set and/or defined for each action type. The following Table 1 illustrates examples of these parameters for various action types which may be selected.

TABLE 1

| MOTION | APPEARANCE CHANGE | MOTION + APPEARANCE CHANGE |
|---|---|---|
| ROI Name/ID<br>Visit Threshold | ROI Name/ID<br>Change Threshold | ROI Name/ID<br>Visit Threshold<br>Change Threshold<br>Heuristic |
| Application Specific Parameters: | Application Specific Parameters: | Application Specific Parameters: |
| Motion magnitude<br>Motion Angle/Direction<br>Motion Size<br>Temporal Features | Background model type: classifier, background, etc. | Background model type: classifier, background, etc.<br>Motion magnitude<br>Motion Angle/Direction<br>Motion Size<br>Temporal Features |

As shown in Table 1, each action type is suitably associated with a ROI, e.g., identified by an appropriate name or ID assigned to the ROI when the ROI was defined and/or established.

For a motion action type, one suitable parameter that is defined is a "visit threshold," e.g., which determines how many times a given motion is to be identified as occurring within the ROI before the defined event is deemed to have been detected or before an alert or notification is to be issued. For example, consider a condiment dispenser having a finite amount of some condiment contained in a reservoir. After some given number of uses of that condiment dispenser, it is likely that the reservoir will be due for refilling. Accordingly, each time a motion is detected within the ROI surrounding the condiment dispenser, it will be deemed that the dispenser was used by an individual responsible for registering detection of that motion. In turn, when the number of detected motion events within the ROI reaches the "visit threshold," an alert or notification can be triggered indicating that the reservoir is likely ready to be refilled. Other parameters to be set in the case of a motion action type may include a motion magnitude, size and/or angle or direction, and/or other spatio-temporal features extracted from the image within the ROI using techniques that include the 3D Scale Invariant Feature Transform (3DSIFT), 3D Histogram of Oriented Gradients (3DHOG), dense trajectories, among others. Using these spatio-temporal features, a classifier can be trained to detect certain types of motion-based actions and/or gestures within the ROI. For example, such parameters may be used to distinguish particular motions of interest (i.e., those motions of a given size and/or occurring in a particular direction) from other spurious motions that may not be of interest or indicative of the event to be detected. For instance, the motion associated with a customer walking through a ROI may be different than the motion associated with a customer disposing of trash in a trash bin within the ROI. By specifying particular motion parameters, these two events can be distinguished from one another, e.g., so that only the event of interest may be detected and/or counted.

For an appearance change action type, one suitable parameter to be set may be a "change threshold." For example, this threshold can be used to determine if there is a sufficient amount of change in appearance in the ROI to warrant issuing an alert or notification. Suitably, another parameter that is set for the appearance change action type may be a background model. In practice, the background model defines a baseline appearance for the ROI against which the image data 130 is compared to determine if an appearance change has occurred within the ROI. The stored model representing the normal appearance of the ROI may also be a trained classifier that is capable of distinguishing between normal and non-normal images found within the ROI.

In exemplary embodiments, the exact thresholds and/or other parameters can be defined and/or set based on prior knowledge and/or given specifications. In practice, one or more counters may be employed by the system 100 to record and/or otherwise maintain a count of how many times an event is detected and/or an action is identified within a ROI. The thresholds and/or counts can then be used in multiple ways, depending on the action type. Suitably, in the case of the motion action type, and the appearance change action type, these thresholds and counts are used to determine if an alert and/or notification should be issued. Optionally, in the case of the motion+appearance change action type, an additional heuristic is defined that combines both of these counts and thresholds. Optionally, for a given action, multiple thresholds can be defined, each associated with a different level of alert and/or notification (e.g., minor, mid-level, high-level, urgent, etc.). Suitably, in response to the action type(s) selected in step 204, only those action type parameters specific to the selected action type(s) are presented to the user for input.

When two or more action types are selected, e.g., such motion and appearance changes, an additional heuristic is optionally defined based on the relationship therebetween. There are many possible combinations and events that can be detected when comparing the counters from each of these action types. Some example heuristics for several different actions are given in the following Table 2.

TABLE 2

| | HEURISTIC | EXAMPLE EVENTS |
|---|---|---|
| 1. | If appearance changes and no motion has been detected for _____ seconds, trigger alert. | Detecting trash/clutter, spilled drinks, left behind on tables, floors, counter, etc.<br>Detecting an overfull trash bin |
| 2. | If appearance has not changed and no motion has been detected for _____ seconds, turn off alert, if it is on. | Trash/clutter, etc. has been cleaned<br>Trash bin has been emptied |

In the first example of Table 2, an appearance change that is detected after no motion has been detected for some period of time triggers an alert for the ROI. Suitably, this type of heuristic can monitor trash and clutter that is left behind on tables and floors, or detecting when a trash bin is overfull. Alternatively, if an alert is given for some event, then the ROI can be used to determine when the alert should be stopped by checking if the opposite event has occurred (see, for example, Table 2, example 2), i.e., the appearance is back to normal and no motion has been detected for some amount of time.

Finally, as shown in step 208, the established event to be detected in a specified ROI as per the just completed configuration is saved or otherwise stored for use by the system 100 during the processing operations. That is to say, the defined ROI, selected action type(s) and/or related configuration parameters are stored, e.g., in the memory 114. Optionally, the configuration process 200 and/or steps therein may be repeated as desired for each ROI to be monitored and/or for each event to be detected.

Figure 4:
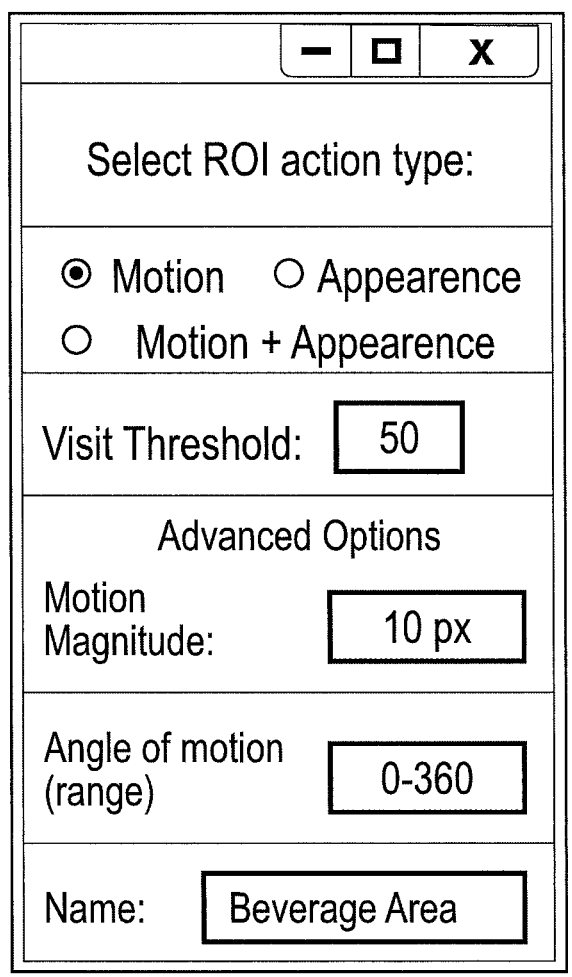
FIG. 4 is a diagrammatic illustration showing an exemplary graphical user interface (GUI) in accordance with aspects of the present inventive subject matter suitable for inputting and/or otherwise collecting various configuration parameters.

With reference now to FIG. 4, there is depicted an exemplary GUI which may be used to enter and/or otherwise collect the various configuration parameters. In the present example, entry fields are included for selection of the action type, a visit threshold, motion specific parameters and a name. In the present example, a motion action type is selected and hence fields are present for entry of the specific parameters related to the selected action type. Alternately, if another action type is selected, alternate fields specific to the action type selected would be presented.

Having thus been configured, the system 100 may now enter a processing and/or active detection mode of operation, e.g., governed via the processing module 122. Suitably, during processing, the defined ROI(s) within the received image data 130 are monitor and/or analyzed by the system 100 (e.g., by the event detection device 102) to detect one or more events and/or action types specified for the respective ROI(s).

For example, if a motion action type is specified for a particular ROI, then the event detection device 102 determines if a defined motion has occurred within the ROI. Suitably, a counter associated with that ROI may be incremented each time the defined motion is detected within that ROI. Optionally, the type of motion that can trigger the counter may be restricted to a certain direction, magnitude, or some combination of both, depending on the parameter(s) defined during the configuration process. In practice, there are many suitable methods and/or techniques that can be used for detecting motion, including but not limited to optical flow and double differencing. In one suitable embodiment, when using optical flow, pixel displacements within the ROI may be summed to generate both the general direction of motion as well the magnitude. In the case of double-differencing, the system 100 optionally estimates both the magnitude and direction by analyzing the motion of foreground "blobs" that are segmented from the background. Optionally, a more sophisticated approach can be implemented that relies on training a classifier to distinguish between different types of motion patterns over time. In one suitable embodiment, spatio-temporal feature descriptors may be extracted over a fixed time interval and a classifier may be trained to recognize specific actions that have occurred within the ROI. Suitably, using this type of approach, it may be possible to perform finer-grain discrimination. For example, it may be possible to determine if a condiment pump is being pressed, or if a part of the customer's body moved in the region. In practice, regardless of the type of motion detection employed, when the counter that is incremented each time a motion event is detected reaches a value over a pre-defined threshold (e.g., established during the configuration process), an alert and/or notification that is associated with the ROI may be triggered. Examples of events that may be detected and/or monitored using this approach include but are not limited to: the number of times the condiment area was accessed, the number of times packets of ketchup are retrieved, the number of times the soda fountain machine was accessed, table occupancy, etc.

In another example, if an appearance change action type is specified for a particular ROI, then the event detection device 102 determines if an appearance change has occurred within the ROI. Suitably, an "appearance change" is determined comparing the current appearance within the ROI (as represented by the received image data 130) with a stored model of the ROI which represents the nominal baseline appearance of the ROI. If the comparison shows and/or results in a significant difference, then an appearance change is detected to have occurred. In practice, the model may be a trained classifier built using texture features such as Local Binary Patterns (LBPs), histograms based on intensity values, edges, color, or some other feature extracted from images taken of the nominal baseline appearance found within the ROI. Optionally, any of a variety of suitable classifier types may be used, including but not limited to, a Support Vector Machine (SVM), decision trees, nearest neighbor, K-mean, neural networks, etc. In practice, regardless of the features and/or the classifier used to train the model, the features extract from the ROI are compared and/or classified with the stored model and decision is made whether the appearance has been significantly changed or not. Optionally, if an appearance change has been detected, then a non-similarity counter may be incremented, which counter represents how many times the appearance has changed. Suitably, when the non-similarity counter reaches a certain threshold (e.g., defined during the configuration process), then an alert and/or notification may be issued. Examples of events that may be detected and/or monitored using this approach include but are not limited to: trash/clutter left behind by a customer, an empty condiment area, table occupancy, etc.

It should be appreciated that when two or more action types are selected for a given ROI (e.g., motion and appearance change), the system 100 and/or event detection device 102 determines when each of the selected action types has been detected, e.g., as described above. Additionally, using set heuristics defining the relationship between the various selected action types (as discussed above) the system 100 is able to detect several different kinds of events, e.g., that rely on the detection of both motion and appearance changes. Suitably, each heuristic may include definitions of the application specific parameters for both motion and appearance change. Suitably, an alert or notification may be given (or stopped) when the conditions defined by the heuristic are met.

In addition to combining multiple action types within one ROI, it is also contemplated that multiple ROIs may be combined to form a higher level understanding of some events. For example, if multiple ROI's are defined for the condiment and fountain drink area (e.g., the self-serve station 300), then an overall event can be associated with the relationship between these ROI's. This allows for a single event alert or notification being triggered (e.g., "Condiment area needs attended") that relies on several separate ROI action alerts being triggered.

In one suitable embodiment, in addition to alerts and/or notifications, other pertinent information may be output by the system 100 in response to detected events. For example, one ROI may be defined to monitoring the number of times cups are retrieved therefrom, and another ROI may be defined to monitor the number of times a drink dispenser is used. By monitoring both ROIs, each with their own activities defined, it is then possible to compare the number of times the drink dispenser was used in relation to the number of times cups were retrieved, which can indicate the number of times customers get refills. It should be appreciated that other combinations are also possible, for example, drink dispenser use compared with condiment use, trash bin use compared with food tray returns, etc. Accordingly, the system 100 may be configured to detect various events and record, report and/or otherwise output the number and/or frequency of detected events and/or other statistical and/or comparative data related to the events detected.

Figure 5:
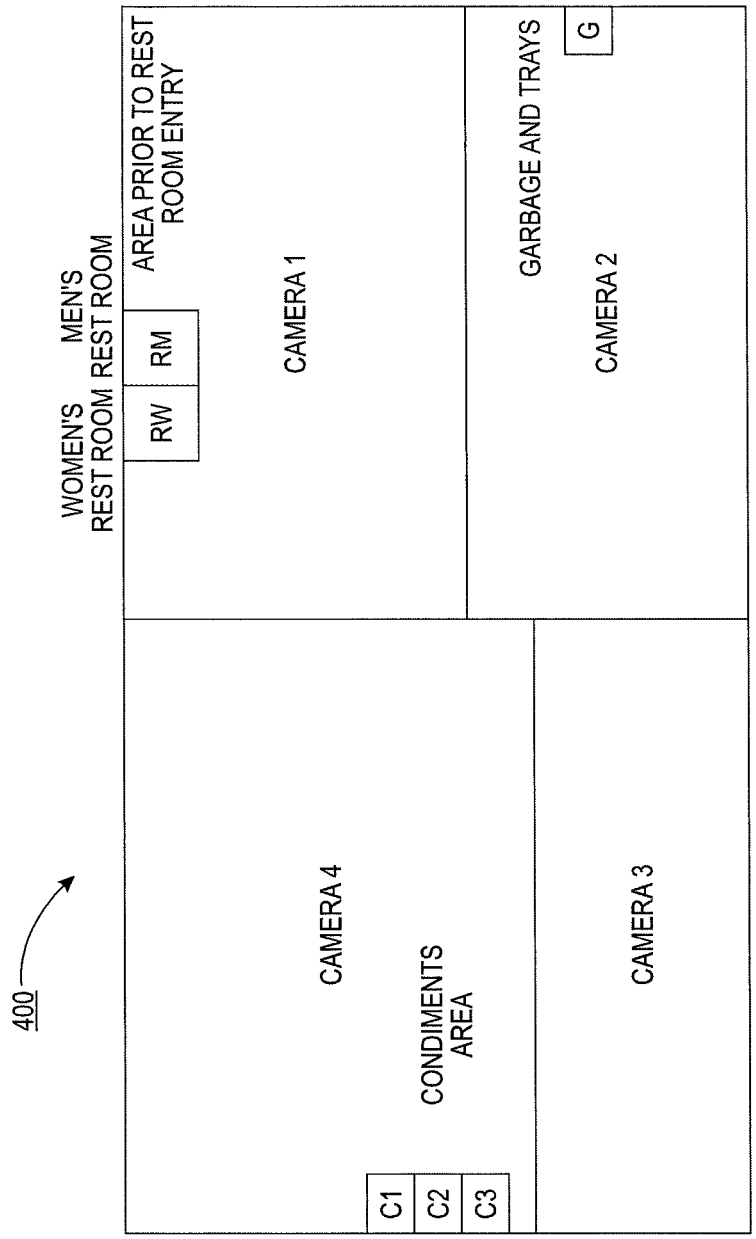
FIG. 5 is a diagrammatic illustration showing another exemplary environment in which the system of FIG. 1 is configured to operate.

With reference now to FIG. 5, there is shown another exemplary environment in which the system 100 is deployed. In this illustrated example, a retail environment 400 (e.g., a restaurant) is divided into a number of areas monitored by a plurality of cameras 104 (e.g., as shown in FIG. 1). As shown in FIG. 5, each area is identified by a camera number or other like identifier corresponding to a particular camera 104 monitoring that area, i.e., camera 1, camera 2, etc. Suitably, the system 100 and/or the event detection device 102 are provisioned with such identifiers to distinguish the sources of image data. For example, optionally, each camera 104 is provisioned with a unique identifier and that identifier is provided along with the image data 130 sent to the event detection device 102. In this way, the event detection device 102 is made aware of the source of particular image data received thereby, and hence, the area monitored.

As shown in FIG. 5, within each area, there are one or more ROIs defined (e.g., as described herein) which correspond to the locations of various store resources. Specifically, the area monitored by camera 1 includes two ROIs, name one label RW which corresponds to a women's restroom and another label RM which corresponds to a men's restroom. The area monitored by camera 4 includes three ROIs, namely those labeled C1, C2 and C3 corresponding to three condiment dispensers. The area monitored by camera 2 includes yet another region of interest, namely one label G which corresponds to a trashcan or garbage bin, e.g., with a rack thereon for collecting and/or dispensing food service trays. Of course, in practice, any number of like or other store resources may be identified with ROIs defined thereabout as disclosed herein. Moreover, while the illustrated example shows four areas monitored by four cameras, more or less areas may be monitored by more or less cameras as is appropriated for the size and/or layout of a given environment.

Figure 6:
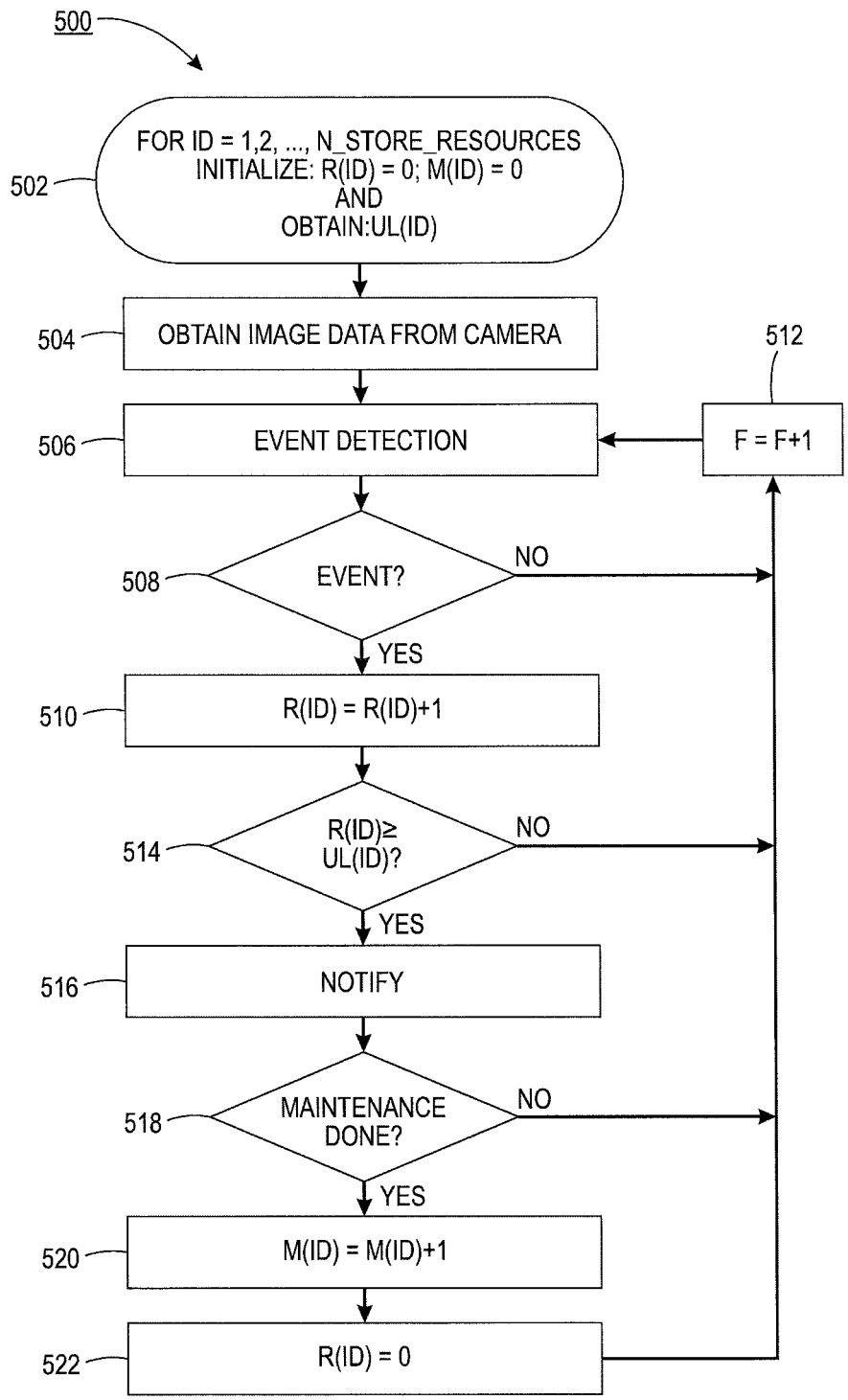
FIG. 6 is a flow chart illustrating an exemplary process executed in accordance with aspects of the present inventive subject matter.

For ease reference and clarity herein, the following nominal parameters shall be used in connection with the present description and in particular the flow chart illustrated in FIG. 6:

F is a parameter which represents a frame number or the like of image data being analyzed for the detection of an event as described herein;

ID is identifier which represents a particular store resource;

N_store_resources is a parameter of which represents the total number of store resources being monitored;

UL is a general parameter which represents an upper limit usage threshold; and UL(ID) is a specific parameter which represents the upper limit usage threshold for the particular store resource identified by the specific ID;

R is a general parameter which represents a current number of detected usages of a store resource; and R(ID) is a specific parameter represents the current number of detected usages of the particular store resource identified by the specific ID; and M is a general parameter which represents the number of times it is detected or otherwise determined that a store resource has been maintained and/or otherwise attended to; and M(ID) is a specific parameter which represents the number of times it is detected or otherwise determined that the particular store resource identified by the specific ID has been maintained and/or otherwise attended to.

Suitably, the various parameters described and/or the respective values therefor are established, provisioned, updated and/or otherwise maintain in the system 100. For example, the various parameters and/or their values may be stored in the memory 114. Optionally, some parameters (e.g., IDs, ULs, etc.) may be set or otherwise entered by a system user, e.g., via the GUI 134 and/or user device 106 and/or in accordance with operation of the configuration module 120.

With reference now to FIG. 6, the depicted flow chart illustrates an exemplary embodiment of a process 500 by which the system 100 operates to monitor an environment (e.g., such as the environment 400 shown in FIG. 5) with cameras 104 in order to detect events (e.g., via the processing module 122) as defined (e.g., via the configuration module 120) and provide alerts, notifications and/or otherwise signal (e.g., via the reporting module 125) when a store resource is due for maintenance. Suitably, the process 500 is executed for each camera 104 employed in the system 100.

More specifically, as shown in FIG. 6, the process 500 begins with an initialization step 502. For example, in step 502, for all store resources (i.e., for all ID=1, 2, 3, . . . , N_store_resources): (i) R(ID) and M(ID) are initialized (e.g., set to zero); and (ii) UL(ID) are obtained, set and/or otherwise determined. Suitably, the IDs and UL(ID)s for the various store resources may be stored in and obtained from the memory 114.

In the next step 504, the image data 130 from a camera 104 is obtained by the event detection device 102, e.g., frame-by-frame or at some other suitable interval. Then, in step 506, the obtained image data 130 is analyzed by the event detection device 102 (e.g., as governed by the processing module 122) to detected an event (e.g., as defined via the configuration module 120). In practice, the detected event will generally involve a particular store resource, e.g., identified by a given ID assigned to and/or otherwise associated with that store resource. Examples of detected events include, without limitation: use of a particular restroom (e.g., use of store resources RM or RW), use of a condiment or other supply dispenser (e.g., use of store resources C1, C2 or C3), or use of a trashcan or garbage bin, returning a tray to or removing a tray from a tray rack (e.g., use of store resource G), etc.

At decision step 508, it is decided if a defined event has been detected in the prior step 506. If a defined event has been detected, the process 500 continues to step 510, otherwise if no defined event has been detected, the process branches to step 512 where the image data 130 is advanced, e.g., to the next frame F (i.e., F=F+1). After having advanced the image data 130 at step 512, the process 500 loops back to step 504.

At step 510, having detected a defined event, a corresponding resource usage counter or the like associated with the store resource involved in the detected event is incremented (i.e., R(ID)=R(ID)+1).

Next, at decision step 514, the current value of the recently incremented resource usage counter R(ID) is compared to the upper limit usage threshold UL(ID) established for the identified store resource ID involved in the detected event. If the number of usages of the particular store resource involved with the detected event meets and/or exceeds the upper limit usage threshold established therefor (i.e., if R(ID)≥UL(ID)), then the process 500 continues to step 516, otherwise the process 500 loops back to step 512.

Suitably, at step 516, an appropriate alert, notification, alarm or other like signal is issued and/or otherwise output indicating that the store resource involved (i.e., the store resource associated with the ID having the corresponding usage counter R(ID) which meets and/or exceeds the upper limit threshold UL(ID)) is due for maintenance and/or would otherwise benefit from being attending to by an appropriate employee or individual. Optionally, the notification (e.g., notification or alert 132) may be output to the user device 106. For example, the notification may indicate that a particular restroom (e.g., RM or RW) is due for servicing, or that a particular condiment dispenser (e.g., C1, C2 or C3) is due for refilling, or that a particular trashcan or garbage bin (e.g., G) is due for emptying, etc.

At decision step 518, it is determined if the store resource involved in the detected event has been subjected to maintenance other otherwise attended to. If no maintenance is detected (or there is otherwise no indication that the store resource has been suitably attended to), then the process 500 loops back to step 512. Otherwise, if maintenance has been detected (or it is otherwise determined that the store resource has been suitably attended to), then the process continues to step 520. In one optional embodiment, under the governance of the configuration module 120, maintenance events are defined which may be detected by the event detection device 102 for resources under the surveillance of the camera(s) 104. In this way, maintenance is detected by the system 100. Alternatively, explicit user input (e.g., via the GUI 134 and/or user device 106) may be used to inform the system 100 that a particular store resource has been maintained and/or otherwise attended to.

Suitably, at step 520, a maintenance counter or the like associated with the store resource having recently been maintained is incremented (i.e., M(ID)=M(ID)+1). In this way, the system 100 keeps track of how many times a store resource is maintained and/or otherwise attended to, e.g., during an operational cycle of the environment or store. Finally, at step 522, insomuch as the store resource has been maintained and/or otherwise attended to, the usage counter associated with the store resource is reset, e.g., to zero (i.e., R(ID)=0).

Various aspects of the present inventive subject matter have been described herein with reference to exemplary and/or preferred embodiments. Obviously, modifications and alterations will occur to others upon reading and understanding the preceding detailed description. It is intended that the inventive subject matter be construed as including all such modifications and alterations insofar as they come within the scope of the appended claims or the equivalents thereof.

The above methods, system, platforms, modules, processes, algorithms and/or apparatus have been described with respect to particular embodiments. It is to be appreciated, however, that certain modifications and/or alteration are also contemplated.

It is to be appreciated that in connection with the particular exemplary embodiment(s) presented herein certain structural and/or function features are described as being incorporated in defined elements and/or components. However, it is contemplated that these features may, to the same or similar benefit, also likewise be incorporated in other elements and/or components where appropriate. It is also to be appreciated that different aspects of the exemplary embodiments may be selectively employed as appropriate to achieve other alternate embodiments suited for desired applications, the other alternate embodiments thereby realizing the respective advantages of the aspects incorporated therein.

It is also to be appreciated that any one or more of the particular tasks, steps, processes, methods, functions, elements and/or components described herein may suitably be implemented via hardware, software, firmware or a combination thereof. In particular, various modules, components and/or elements may be embodied by processors, electrical circuits, computers and/or other electronic data processing devices that are configured and/or otherwise provisioned to perform one or more of the tasks, steps, processes, methods and/or functions described herein. For example, a processor, computer or other electronic data processing device embodying a particular element may be provided, supplied and/or programmed with a suitable listing of code (e.g., such as source code, interpretive code, object code, directly executable code, and so forth) or other like instructions or software or firmware, such that when run and/or executed by the computer or other electronic data processing device one or more of the tasks, steps, processes, methods and/or functions described herein are completed or otherwise performed. Suitably, the listing of code or other like instructions or software or firmware is implemented as and/or recorded, stored, contained or included in and/or on a non-transitory computer and/or machine readable storage medium or media so as to be providable to and/or executable by the computer or other electronic data processing device. For example, suitable storage mediums and/or media can include but are not limited to: floppy disks, flexible disks, hard disks, magnetic tape, or any other magnetic storage medium or media, CD-ROM, DVD, optical disks, or any other optical medium or media, a RAM, a ROM, a PROM, an EPROM, a FLASH-EPROM, or other memory or chip or cartridge, or any other tangible medium or media from which a computer or machine or electronic data processing device can read and use. In essence, as used herein, non-transitory computer-readable and/or machine-readable mediums and/or media comprise all computer-readable and/or machine-readable mediums and/or media except for a transitory, propagating signal.

Optionally, any one or more of the particular tasks, steps, processes, methods, functions, elements and/or components described herein may be implemented on and/or embodiment in one or more general purpose computers, special purpose computer(s), a programmed microprocessor or microcontroller and peripheral integrated circuit elements, an ASIC or other integrated circuit, a digital signal processor, a hardwired electronic or logic circuit such as a discrete element circuit, a programmable logic device such as a PLD, PLA, FPGA, Graphical card CPU (GPU), or PAL, or the like. In general, any device, capable of implementing a finite state machine that is in turn capable of implementing the respective tasks, steps, processes, methods and/or functions described herein can be used.

Additionally, it is to be appreciated that certain elements described herein as incorporated together may under suitable circumstances be stand-alone elements or otherwise divided. Similarly, a plurality of particular functions described as being carried out by one particular element may be carried out by a plurality of distinct elements acting independently to carry out individual functions, or certain individual functions may be split-up and carried out by a plurality of distinct elements acting in concert. Alternately, some elements or components otherwise described and/or shown herein as distinct from one another may be physically or functionally combined where appropriate.

In short, the present specification has been set forth with reference to preferred embodiments. It should be appreciated that modifications and alterations will occur to others upon reading and understanding the present specification. It is intended that the inventive subject matter be construed as including all such modifications and alterations insofar as they come within the scope of the appended claims or the equivalents thereof.

What is claimed is:

1. A computer vision system operative to monitor an environment including a resource located therein, said system comprising:
   an image source that supplies image data representative of at least a portion of the environment monitored by the system, said portion including the resource therein; and
   an event detection device including a data processor and operative to detect an event involving the resource, said event detection device being arranged to:
   (i) be selectively configurable by a user to define the event involving the resource;
   (ii) receive the image data supplied by the image source;
   (iii) analyze the received image data to detect the defined event; and
   (iv) output a notification in response to detecting the defined event;
   wherein configuring the event detection device to define the event comprises:
   establishing a region of interest within the environment monitored by the system and within which the event is to be detected;
   setting a type of activity which is to be detected within the region of interest; and
   selectively receiving a set of input parameters depending on the type of activity set to be detected.

2. The computer vision system of claim 1, wherein said image source is a camera, said camera viewing the portion of the environment monitored by the system.

3. A computer vision system operative to monitor an environment including a resource located therein, said system comprising:
   an image source that supplies image data representative of at least a portion of the environment monitored by the system, said portion including the resource therein, wherein said image source is a camera, said camera viewing the portion of the environment monitored by the system; and
   an event detection device including a data processor and operative to detect an event involving the resource, said event detection device being arranged to:
   (i) be selectively configurable by a user to define the event involving the resource, wherein configuring the event detection device to define the event comprises: (a) establishing a region of interest within the view of the camera and within which the event is to be detected; (b) setting a type of activity which is to be detected within the region of interest; and (c) selectively receiving a set of input parameters depending on the type of activity which is set to be detected;
   (ii) receive the image data supplied by the image source;
   (iii) analyze the received image data to detect the defined event; and
   (iv) output a notification in response to detecting the defined event;
   wherein the type of activity is selectively set such that the event detection device is configured to analyze the image data in order to detect within the established region of interest one or both of: (i) motion occurring therein; and (ii) a persistent change in appearance therein.

4. The computer vision system of claim 3, wherein when the type of activity is selected such that the occurrence of motion is set to be detected, the event detection device provides a prompt for inputting the set of parameters, said set of parameter defining the motion which is set to be detected and including a first parameter which defines a magnitude of the motion to be detected and a second parameter which defines a direction of the motion to be detected.

5. The computer vision system of claim 3, wherein the defined event detected by the event detection device is a usage of the resource by an individual.

6. The computer vision system of claim 5, wherein the event detection device is further arranged to count the number of times the defined event is detected.

7. The computer vision system of claim 6, wherein the event detection device is further arranged to compare the number of times the defined event is detected to a threshold and based on a result of the comparison output the notification, said notification indicating that the resource is due for maintenance.

8. The computer vision system of claim 3, wherein the defined event detected by the event detection device is maintenance of the resource by an individual.

9. The computer vision system of claim 3, wherein the environment is a store and the resource is one of a restroom, a dining table, a drink, condiment or supply dispenser, a trash receptacle or a tray collection rack.

10. A method of monitoring an environment including a resource located therein, said method comprising:
    obtaining image data representative of at least a portion of the environment being monitored, said portion including the resource therein;
    receiving configuration data, said configuration data defining an event involving the resource;
    analyzing the obtained image data to detect the defined event; and
    outputting a notification in response to detecting the defined event;
    wherein said configuration data is operative to:
    establish a region of interest within the environment being monitored and within which the event is to be detected; and
    set a type of activity which is to be detected within the region of interest.

11. The method of claim 10, wherein said image data is obtained from a camera, said camera viewing the portion of the environment being monitored.

12. A method of monitoring an environment including a resource located therein, said method comprising:
    obtaining image data representative of at least a portion of the environment being monitored, said portion including the resource therein;
    receiving configuration data, said configuration data (i) defining an event involving the resource and (ii) being operative to (a) establish a region of interest within the environment being monitored and within which the event is to be detected and (b) set a type of activity which is to be detected within the region of interest;
    analyzing the obtained image data to detect the defined event; and
    outputting a notification in response to detecting the defined event;
    wherein the type of activity is selectively set such that the event to be detected within the established region of interest includes one or both of: (i) motion occurring therein; and (ii) a persistent change in appearance therein; and wherein when the type of activity is selected such that the occurrence of motion is set to be detected, the method further includes:

providing a prompt to input a set of parameters, said set of parameter defining the motion which is set to be detected and including a first parameter which defines a magnitude of the motion to be detected and a second parameter which defines a direction of the motion to be detected.

13. The method of claim 12, wherein the defined event detected is a usage of the resource by an individual.

14. The method of claim 13, further comprising:
counting the number of times the defined event is detected.

15. The method of claim 14, further comprising:
comparing the number of times the defined event is detected to a threshold; and
based on a result of the comparison output the notification, said notification indicating that the resource is due for maintenance.

16. The method of claim 12, wherein the defined event detected is maintenance of the resource by an individual.

17. The method of claim 12, wherein the environment is a store and the resource is one of a restroom, a dining table, a drink, condiment or supply dispenser, a trash receptacle or a tray collection rack.

* * * * *